United States Patent
Xu et al.

(10) Patent No.: US 10,756,648 B2
(45) Date of Patent: Aug. 25, 2020

(54) INVERTER SYSTEM WITH ENHANCED COMMON SOURCE INDUCTANCE GENERATED AT GATE DRIVER

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 16/186,973

(22) Filed: Nov. 12, 2018

(65) Prior Publication Data

US 2020/0153362 A1 May 14, 2020

(51) Int. Cl.
| | |
|---|---|
| *H02M 7/5387* | (2007.01) |
| *H03K 17/16* | (2006.01) |
| *H02M 1/084* | (2006.01) |
| *H02M 1/00* | (2006.01) |
| *H02P 27/08* | (2006.01) |

(52) U.S. Cl.
CPC ....... *H02M 7/53871* (2013.01); *H02M 1/084* (2013.01); *H03K 17/165* (2013.01); *H02M 2001/0009* (2013.01); *H02M 2001/0054* (2013.01); *H02P 27/08* (2013.01)

(58) Field of Classification Search
CPC ............. H02M 7/53871; H02M 1/084; H02M 2001/0009; H02M 2001/0054; H03K 17/165; H02P 27/08
See application file for complete search history.

(56) References Cited

U.S. PATENT DOCUMENTS

| | | |
|---|---|---|
| 7,952,418 B2 | 5/2011 | McDonald et al. |
| 9,304,147 B2 | 4/2016 | Schwartz et al. |
| 9,712,038 B2 | 7/2017 | Miyauchi et al. |
| 9,813,009 B1 | 11/2017 | Xu et al. |
| 9,991,880 B2 | 6/2018 | Xu et al. |

(Continued)

OTHER PUBLICATIONS

Z. Wang et al., "A fast overcurrent protection scheme for IGBT modules through dynamic fault current evaluation," 2013 Twenty-Eight Annual IEEE Applied Power Electronics Conference and Exposition (APEC), Long Beach, CA 2013, pp. 577-583.

*Primary Examiner* — Matthew V Nguyen
*Assistant Examiner* — Jye-June Lee
(74) *Attorney, Agent, or Firm* — David B. Kelley; MacMillan, Sobanski & Todd, LLC

(57) ABSTRACT

A multiphase inverter for an electric vehicle drive has a plurality of drivers to provide drive signals to respective gate loops of upper and lower transistors in the phase legs. A transformer has a secondary winding in a first gate loop of a first transistor in one phase leg and a primary winding connecting a Kelvin-emitter of the first transistor to a Kelvin-emitter of a second transistor in the other phase leg. Switching transients of transistors are shortened because when gate signal is toggled to change a conduction state of a transistor in a first phase leg, a rate of current change in the first leg is sensed in a transformer primary winding connected across a stray inductance of the first leg. A voltage proportional to the sensed rate is added to the gate signal via a transformer secondary winding, thereby increasing a common source inductance of the transistor.

15 Claims, 6 Drawing Sheets

(56) References Cited

U.S. PATENT DOCUMENTS

| | | | |
|---|---|---|---|
| 10,011,178 B1 | 7/2018 | Xu et al. | |
| 10,037,977 B2 | 7/2018 | Lei et al. | |
| 2007/0025123 A1* | 2/2007 | Kim | H03K 17/04123 363/16 |
| 2012/0112530 A1* | 5/2012 | Komatsu | B60L 3/003 307/9.1 |
| 2013/0044527 A1* | 2/2013 | Vracar | H02M 7/487 363/131 |
| 2018/0159440 A1* | 6/2018 | Xu | H02M 7/537 |
| 2019/0222108 A1* | 7/2019 | Xu | H03K 17/127 |

\* cited by examiner

INVERTER SYSTEM WITH ENHANCED COMMON SOURCE INDUCTANCE GENERATED AT GATE DRIVER

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to electric inverter drives for electrified vehicles, and, more specifically, to improving switching characteristics in a multi-phase inverter by enhancing a common source inductance in a gate loop of a power transistor without modification of a power module incorporating the power transistor.

Electric vehicles, such as hybrid electric vehicles (HEVs), plug-in hybrid electric vehicles (PHEVs), and battery electric vehicles (BEVs), use inverter-driven electric machines to provide traction torque to the wheels. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. Each phase leg is constructed as a half bridge with a high-side transistor connected in series with a low-side transistor between the DC buses. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Semiconductor switching devices such as an IGBT or a MOSFET are driven at a gate terminal by a gate signal provided by a driver circuit. For an IGBT, the gate signal is applied between the gate terminal and an emitter terminal of the device. In the ON state, an output signal is conducted through the device between a collector terminal and the emitter terminal. During the ON state, current within the device flows within a gate loop and within a power loop.

Common source inductance refers to an inductance shared by the main power loop (i.e., the drain-to-source or collector-to-emitter power output of the transistor) and the gate loop (i.e., gate-to-source or gate-to-emitter) in a power switching transistor. The common source inductance carries both the device output current (e.g., drain to source current) and the gate charging/discharging current. Due to the coupling between the input and output of the transistor, current in the output (power loop) portion of the common source inductance modifies the gate voltage in a manner that can be used to reinforce (e.g., speed up) the switching performance. The opportunity to reduce switching time may be desirable since it may have an associated reduction in the energy consumed (i.e., lost) during the switching transition. The magnitude of the gate loop inductance and/or the power loop inductance and the degree of mutual coupling between them can be manipulated (e.g., enhanced) by selecting an appropriate layout and/or including added overlapping coils in PCB traces forming conductive paths to the transistor gates or emitters in order to obtain a desired common source inductance, for example. Various examples of structural modifications within a power module to enhance the common source inductance are shown in U.S. patent application publication 2018/0152113A1, U.S. patent application publication 2018/0123478A1, U.S. Pat. Nos. 9,994,110, and 10,122,294, each of which is incorporated herein by reference in their entirety.

A typical inverter system for an electric drive utilizes one or more power modules containing the power switching devices (e.g., IGBTs) and associated components (such as a reverse diode across each IGBT) arranged according to the phase legs of the bridge configuration. The power modules typically generate a large amount of heat, so they are often attached to a coldplate (e.g., a liquid cooled heatsink) for better thermal performance. A controller and the gate driver circuits for the inverter are typically separated from the power module(s) by situating them on a separate circuit board and/or module from the power modules.

Since the common source inductance is a coupling between the gate loop and the power loop of a switching device, known methods for enhancing the common to source inductance have relied on modifications to the power module since that is where the two loops are in close proximity. However, the power module for use in vehicle electric drive systems must satisfy stringent requirements concerning reliability, efficiency, durability, and cost. Another important consideration is packaging size. When changing the power module design and manufacturing process to add structures or components that increase the common source inductance between the gate loop and power loop, the packaging size for the power module has been increased. Furthermore, customized components increase the parts cost and the manufacturing cost of the power module. Therefore, it would be desirable to increase common source inductance without an increase in the number of components in the power module or making any other unique modifications in the power module.

SUMMARY OF THE INVENTION

The invention enhances common source inductance $L_{CS}$ without the need to modify the power module design. As part of a gate driver, the invention introduces a respective transformer for each phase leg, wherein the transformer primary side is connected between the Kelvin emitters or the Kelvin collectors of switching devices (via the wiring available at the gate driver) for the respective phase leg and another one of the phase legs in order to sense changes in current (di/dt), and wherein the transformer secondary side is connected in the respective gate loop to manipulate the gate waveforms to achieve desired switching waveform modifications according to an enhanced common source inductance ($L_{CS}$). The transformers and their interconnections can be implemented on a gate drive board, for example. Therefore, no modifications are made in the power module.

In one primary aspect of the invention, an inverter comprises two phase legs each having upper and lower transistors with gate loops between respective gate and Kelvin-emitter terminals. A plurality of drivers provide drive signals to respective gate loops. A transformer has a secondary winding in a first gate loop of a first transistor in one phase leg and a primary winding connecting a Kelvin-emitter of the first transistor to a Kelvin-emitter of a second transistor in the other phase leg.

In another aspect of the invention, a method shortens switching transients of transistors in a multiphase inverter. When gate signal is toggled to change a conduction state of a transistor in a first phase leg, a rate of current change in the first leg is sensed in a transformer primary winding connected across a stray inductance of the first leg. A voltage proportional to the sensed rate is added to the gate signal via a transformer secondary winding.

DETAILED DESCRIPTION OF PREFERRED EMBODIMENTS

Figure 1:
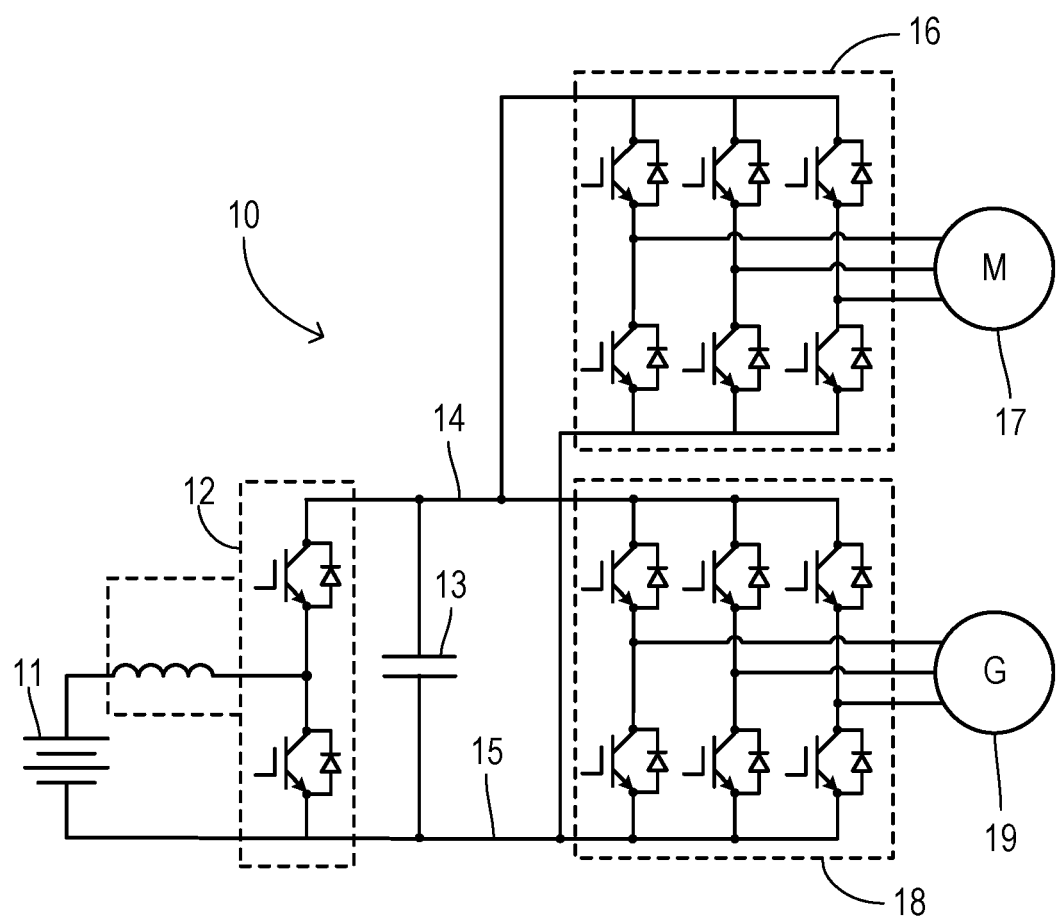
FIG. 1 is a schematic, block diagram showing an electric drive portion of a hybrid electric vehicle of a type for adopting the present invention.

Referring to FIG. 1, an electric drive section 10 of an electrified vehicle includes a battery pack 11 (or other DC source) coupled by contactor relay switches (not shown) to a variable voltage converter (VVC) 12. VVC 12 includes upper and lower insulated gate bipolar transistors (IGBTs) connected in series between a positive DC bus 14 and a negative DC bus 15. A main DC linking capacitor 13 is connected buses 14 and 15. VVC 12 typically performs a DC-DC conversion between a supply voltage of battery 11 and a higher DC link voltage adapted for operating with a motor 17 and a generator 19. A motor inverter 16 and a generator inverter 18 are coupled between buses 14 and 15. Inverters 16 and 18 are each comprised of a plurality of switching devices (e.g., IGBTs) in a bridge configuration. For example, inverter 16 has three phase legs each with an upper IGBT in series with a lower IGBT, wherein a junction between each upper and lower IGBT is connected to a respective phase winding of motor 17. The switching devices in inverters 16 and 18 and in VVC 12 are driven according to control signals from a controller and gate driver (not shown) in a conventional manner (e.g., using pulse width modulation).

Figure 2:
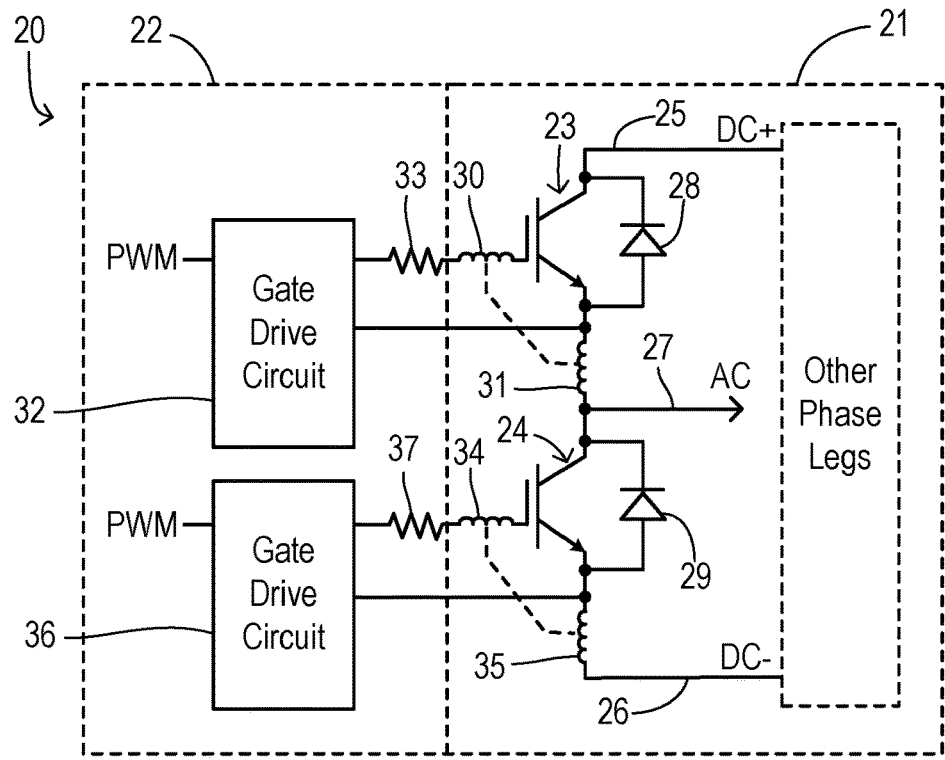
FIG. 2 is a schematic diagram showing a prior art equivalent circuit for a phase leg of an inverter having a pair of IGBTs each of which exhibits a common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 2 shows an inverter system controller 20 including a power module assembly 21 and a gate driver board 22. A half-bridge phase leg is shown in detail with a high-side (i.e., upper) transistor 23 and a low-side (i.e., lower) transistor 24 (each shown as an IGBT with gate, collector, and emitter terminals). Other types of semiconductor devices could be used, such as a MOSFET. As used herein, the gate, collector, and emitter terminals of an IGBT also refer to gate, drain, and source terminals of a MOSFET. Transistors 23 and 24 are connected in series between a positive bus 25 and a negative bus 26 to define an intermediate (i.e., output) junction 27. Anti-parallel diodes 28 and 29 are connected across transistors 23 and 24. Other phase legs not shown in detail are identical.

The gate and emitter terminals of transistor 23 create an upper common source inductance comprised of a gate loop inductance 30 magnetically coupled to a power loop (i.e., emitter-side) inductance 31. A gate drive circuit 32 and a gate resistor 33 are coupled to the gate terminal in order to control the switching of upper transistor 23. The gate and emitter terminals of transistor 24 create a lower common source inductance ($L_{CS}$) comprised of a gate loop inductance 34 magnetically coupled to a power loop inductance 35. A gate drive circuit 36 and a gate resistor 37 are coupled to the gate terminal in order to control the switching of lower transistor 34. By carefully adjusting the magnitude of the common source inductances, a favorable impact can be obtained on the switching times and energy loss associated with switching the devices on and off. However, prior efforts have directly targeted the magnetic coupling present at the power module to achieve a desired common source inductance.

Figure 3:
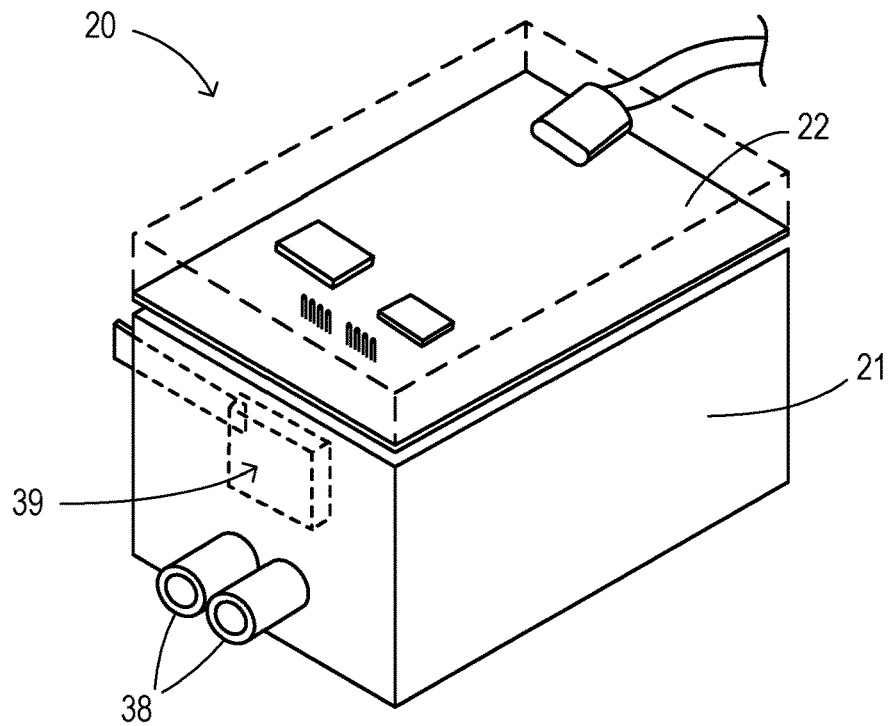
FIG. 3 is a perspective view of an inverter system controller.

FIG. 3 shows a physical construction of inverter system controller 20 wherein power module assembly 21 has cooling channels 38 for dissipating heat generated by a stack of individual half bridge power modules 39 mounted in assembly 21. Drive board 22 may preferably be attached externally to an enclosure for assembly 21 containing the high current, heat generating components so that drive board 22 is thermally isolated from the height temperatures. Since gate drive 22 may employ common printed circuit board technologies, added components for enhancing a common source inductance are more easily and more cheaply incorporated within the gate drive board portion of module 20. The power module assembly and inverter system controller may be constructed as shown in U.S. Pat. No. 10,037,977, entitled "Power Electronics System," which is hereby incorporated by reference.

Figure 4:
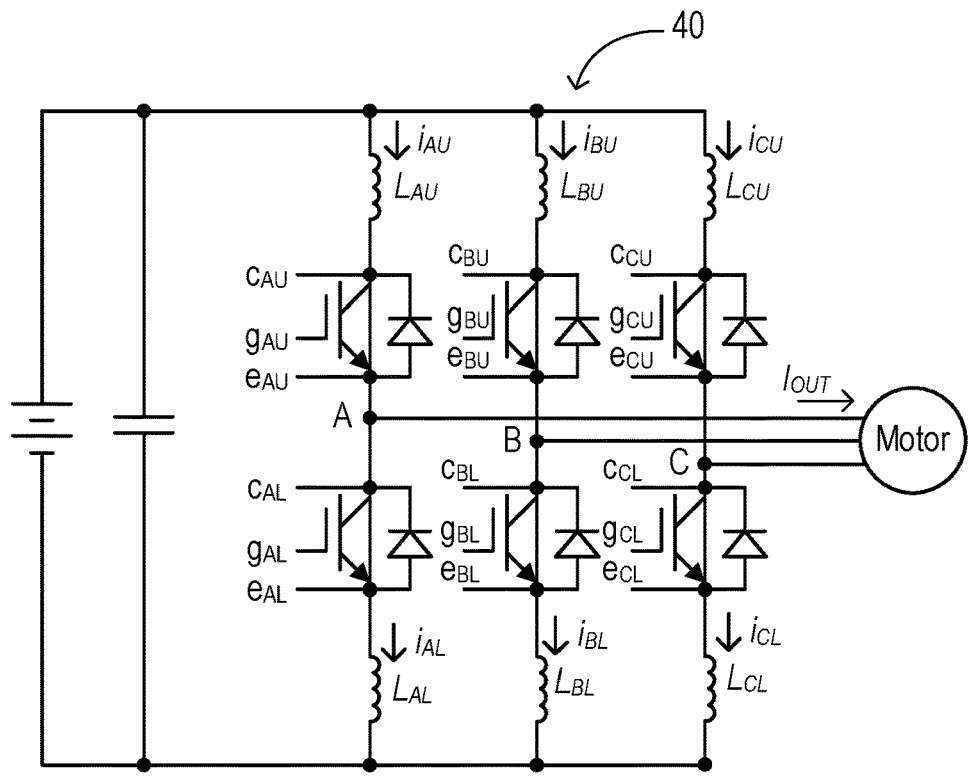
FIG. 4 is a schematic diagram showing inverter phase legs in greater detail, including power switching devices with Kelvin emitter and Kelvin collector terminals.

FIG. 4 shows a motor inverter 40 in greater detail showing Kelvin transistor terminals and stray inductances utilized in a preferred embodiment of the invention. A three phase inverter is shown with phases denoted as Phase A, Phase B, and Phase C. In the following discussion, subscripts AU indicate an upper element in Phase A, AL indicate a lower element in Phase A, and so on. Each switching device is shown with a gate terminal, a Kelvin-emitter terminal, and a Kelvin-collector terminal (e.g., terminals $g_{AL}$, $e_{AL}$, and $c_{AL}$ for the lower switching device in Phase A). There are stray (i.e., parasitic) inductances distributed along the power loops defined by the DC-link capacitor and the switching devices (e.g., stray inductances $L_{AU}$ and $L_{AL}$ for Phase A), which are usually in the range of 1 nH to 100 nH. The current flowing through the upper device of Phase A is $i_{AU}$, and the current flowing through the lower device of Phase A is $i_{AL}$, which are related as shown in Equation (1):

$$i_{AU} - i_{AU} - I_{out} \quad (1).$$

Since the output current $I_{out}$ can be considered constant during the switching transient, the slope of $i_{AU}$ and $i_{AL}$ are equal, as shown in Equation (2):

$$\frac{di_A}{dt} = \frac{di_{AU}}{dt} = \frac{di_{AL}}{dt}. \quad (2)$$

The voltage between the Kelvin-collectors $c_{AU}$ and $c_{BU}$ can be expressed by Equation (3), and the voltage between the Kelvin emitters $e_{AL}$ and $e_{BL}$ can be expressed by equation (4):

$$v_{cAUcBU} = L_{AU} \cdot \frac{di_A}{dt} - L_{BU} \cdot \frac{di_B}{dt}, \quad (3)$$

$$v_{eALeBL} = L_{AL} \cdot \frac{di_A}{dt} - L_{BL} \cdot \frac{di_B}{dt}. \quad (4)$$

By considering a nominal switching performance (e.g., speed) of the selected transistors within the context of a particular inverter/driver design, a corresponding value of an enhanced common source inductance ($L_{CS}$) that achieves a targeted performance improvement (e.g., shortening of the switching transient to reduce switching losses) can be determined. The voltage created by the target common source inductance $L_{CS}$ can then be calculated in Equations (5)-(7) for Phases A, B, and C, respectively, as follows:

$$L_{CS} \cdot \frac{di_A}{dt} = \quad (5)$$

$$\frac{L_{CS} \cdot L_{BL}}{L_{AU} \cdot L_{BL} - L_{AL} \cdot L_{BU}} \cdot v_{cAUcBU} - \frac{L_{CS} \cdot L_{BU}}{L_{AU} \cdot L_{BL} - L_{AL} \cdot L_{BU}} \cdot v_{eALeBL}$$

$$L_{CS} \cdot \frac{di_B}{dt} = \quad (6)$$

$$\frac{L_{CS} \cdot L_{CL}}{L_{BU} \cdot L_{CL} - L_{BL} \cdot L_{CU}} \cdot v_{cBUcCU} - \frac{L_{CS} \cdot L_{CU}}{L_{BU} \cdot L_{CL} - L_{BL} \cdot L_{CU}} \cdot v_{eBLeCL}$$

$$L_{CS} \cdot \frac{di_C}{dt} = \quad (7)$$

$$\frac{L_{CS} \cdot L_{AL}}{L_{CU} \cdot L_{AL} - L_{CL} \cdot L_{AU}} \cdot v_{cCUcAU} - \frac{L_{CS} \cdot L_{AU}}{L_{CU} \cdot L_{AL} - L_{CL} \cdot L_{AU}} \cdot v_{eCLeAL}$$

where $v_{cAUcRU}$ is the voltage between the Kelvin-collector of the upper transistor in Phase A and the Kelvin-collector of the upper transistor in Phase B, and $v_{eALeBL}$ is the voltage between the Kelvin-emitter of the lower transistor in Phase A and the Kelvin-emitter of the lower transistor in Phase B, for example.

Figure 5:
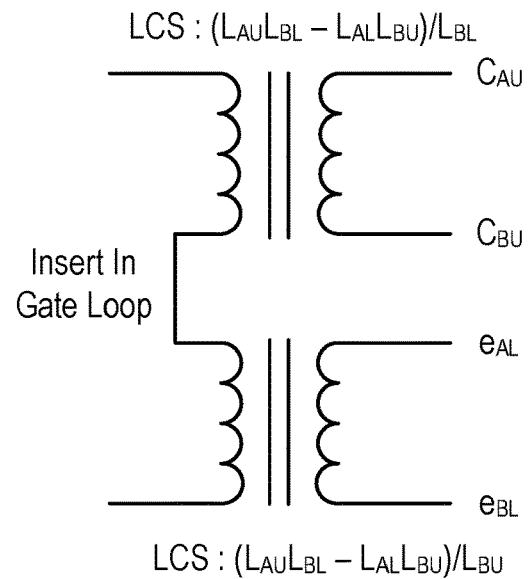
FIG. 5 shows a transformer of the invention indicating the winding connections and a desired turns ratio for each primary winding.

The desired voltages can be created and injected into each gate loop using transformers having a certain turns ratio as shown in FIG. 5. In one preferred embodiment, the transformer has two separate primary windings, each connected across an upper and a lower stray inductance, respectively. The secondary side may have a secondary winding (e.g., in two sections) magnetically coupled to each of the primary windings, wherein the secondary winding sections are connected in series in a respective gate loop of the transistor being controlled. The turns ratio for when the secondary winding in FIG. 5 is connected to the upper (i.e., collector) side of the phase leg for Phase A is $$\frac{L_{AU} \cdot L_{BL} - L_{AL} \cdot L_{BU}}{L_{BL}} : L_{CS}.$$

similarly, when the secondary winding in FIG. 5 is connected to the lower (i.e., emitter) side of the phase leg for Phase A, the turns ratio is $$\frac{L_{AU} \cdot L_{BL} - L_{AL} \cdot L_{BU}}{L_{BU}} : L_{CS}.$$

Figure 6:
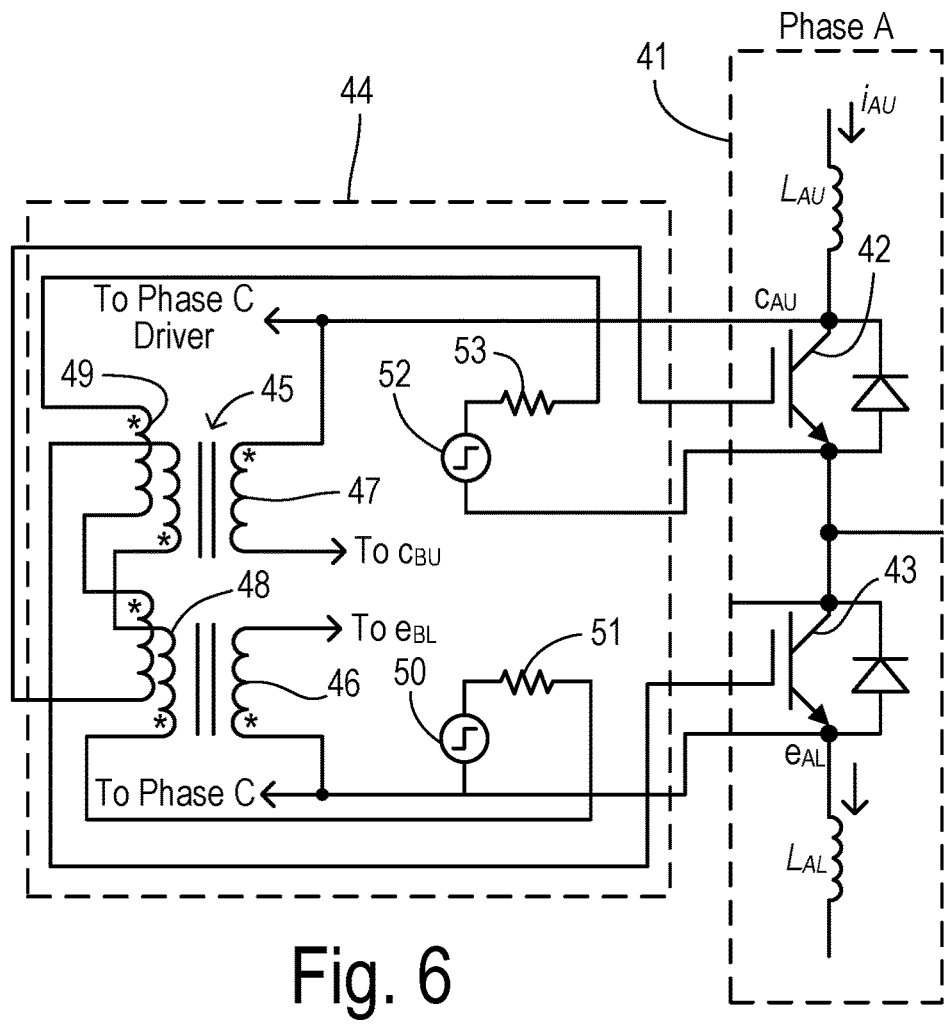
FIG. 6 is a schematic, block diagram showing a phase leg with gate drivers interconnected with a transformer providing a controlled enhancement of a common source inductance for the upper and lower switching devices.

A corresponding detailed circuit for Phase A is shown in FIG. 6. In a power module 41, Phase A includes an upper transistor 42 and a lower transistor 43. Preferably, transistors 42 and 43 are driven via gate loops between their gate terminals and respective Kelvin-emitter terminals. The full output currents are carried by regular emitter terminals as known in the art. Both transistors 42 and 43 may have Kelvin-collectors (e.g., bypassing the main inputs currents of the transistors), although only the Kelvin-collector of transistor 42 is utilized in the present embodiment.

A gate drive board 44 has a transformer 45 with a pair of primary windings 46 and 47. A secondary winding 48 has sections magnetically coupled with each of primary windings 46 and 47, and two ends of secondary winding 48 are connected in a gate loop for lower transistor 43 between a gate driver 50 and gate resistor 51. A secondary winding 49 has sections magnetically coupled with each of primary windings 46 and 47, and two ends of secondary winding 49 are connected in a gate loop for upper transistor 42 between a gate driver 52 and gate resistor 53. The in-phase and out-of-phase relationships between the pairs of primary and secondary windings are as shown by dots, in order to provide the positive and negative components of the voltages as defined in Equations (5)-(7). Furthermore, primary winding 46 is coupled between Kelvin-emitter $e_{AL}$ of transistor 43 and a Kelvin-emitter $e_{BL}$ of a lower transistor in Phase B. Primary winding 47 is coupled between Kelvin-collector $c_{AU}$ of transistor 42 and a Kelvin-collector $c_{BU}$ of an upper transistor in Phase B. These connections of primary windings 46 and 47 enable them to sense the changing current levels $i_{AU}$ and $i_{AL}$ flowing through stray inductances $L_{AU}$ and $L_{AL}$, respectively. For the purpose of a respective transformer for Phase C sensing current in that phase, Kelvin-collector $c_{AU}$ and Kelvin-emitter $e_{AL}$ are connected to the Phase C transformer elsewhere on gate drive board 44.

Figure 7:
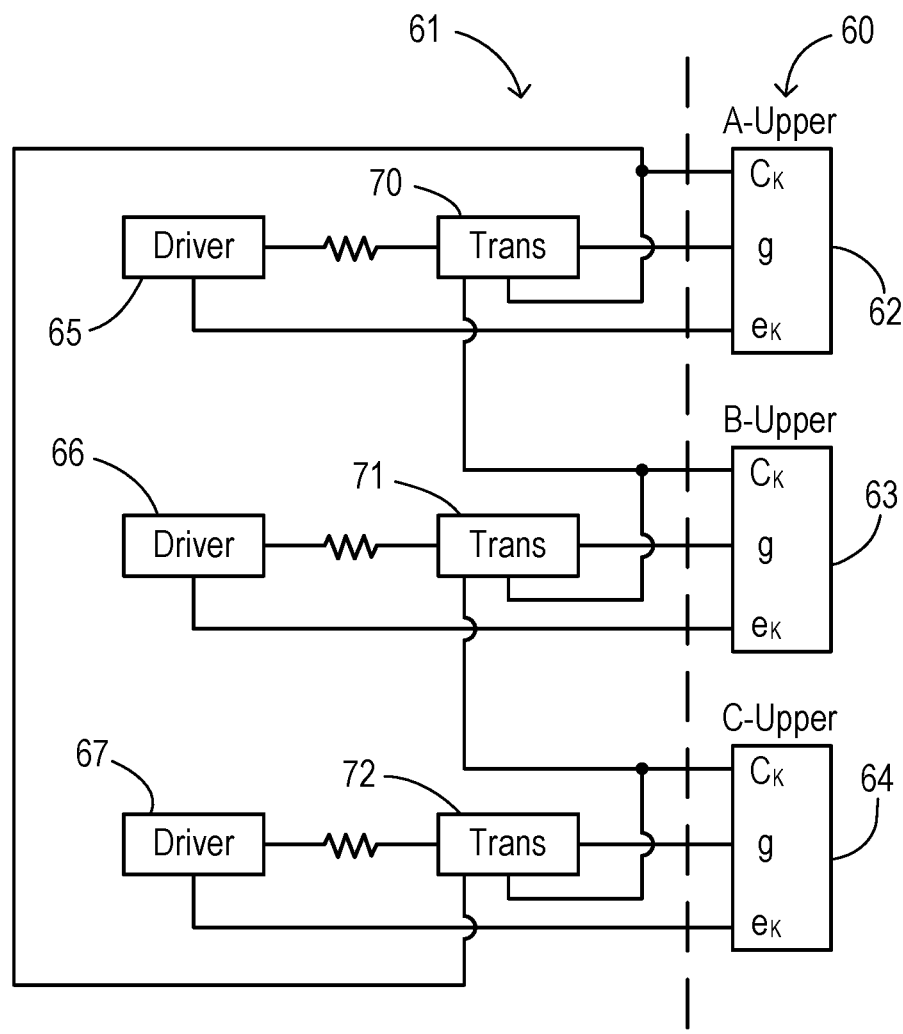
FIG. 7 is a block diagram showing one preferred embodiment of transformer connections for the upper phase leg switching devices in a three phase inverter.

FIG. 7 illustrates the "round robin" arrangement for interconnecting the transformer primary windings for the upper transistors of Phases A, B, and C. A power module assembly 60 has upper transistors 62, 63, and 64 for Phases A, B, and C, each transistor having Kelvin-collector, gate, and Kelvin-emitter terminals. On a gate board 61, there are driver circuits 65, 66, and 67 for transistors 62, 63, and 64, respectively. A transformer 70 for Phase A has a secondary winding connected in the gate loop with driver circuit 65 between the gate and Kelvin-emitter terminals of transistor 62. A transformer 71 for Phase B has a secondary winding connected in the gate loop with driver circuit 66 between the gate and Kelvin-emitter terminals of transistor 63. A transformer 72 for Phase C has a secondary winding connected in the gate loop with driver circuit 67 between the gate and Kelvin-emitter terminals of transistor 64. Transformer 70 has an upper primary winding connected between the Kelvin-collector terminal of transistor 62 (Phase A) and the Kelvin-collector terminal of transistor 63 (Phase B). Transformer 71 has an upper primary winding connected between the Kelvin-collector terminal of transistor 63 (Phase B) and the Kelvin-collector terminal of transistor 64 (Phase C). Transformer 72 has an upper primary winding connected between the Kelvin-collector terminal of transistor 64 (Phase C) and the Kelvin-collector terminal of transistor 62 (Phase A).

The interconnection of transformers 70-72, each having a turns ratio as discussed above, shortens switching transients of transistors 62-64 by effectively introducing enhanced common source inductance with respect to each transistor. When any one of the gate drive signals is toggled to change a conduction state of a respective transistor, a rate of current change is sensed by the respective transformer primary winding which is connected across a stray inductance of the respective phase leg. The secondary winding of the respective transformer adds a voltage proportional to the sensed rate to the gate drive signal, thereby producing the desired effect.

Figure 8:
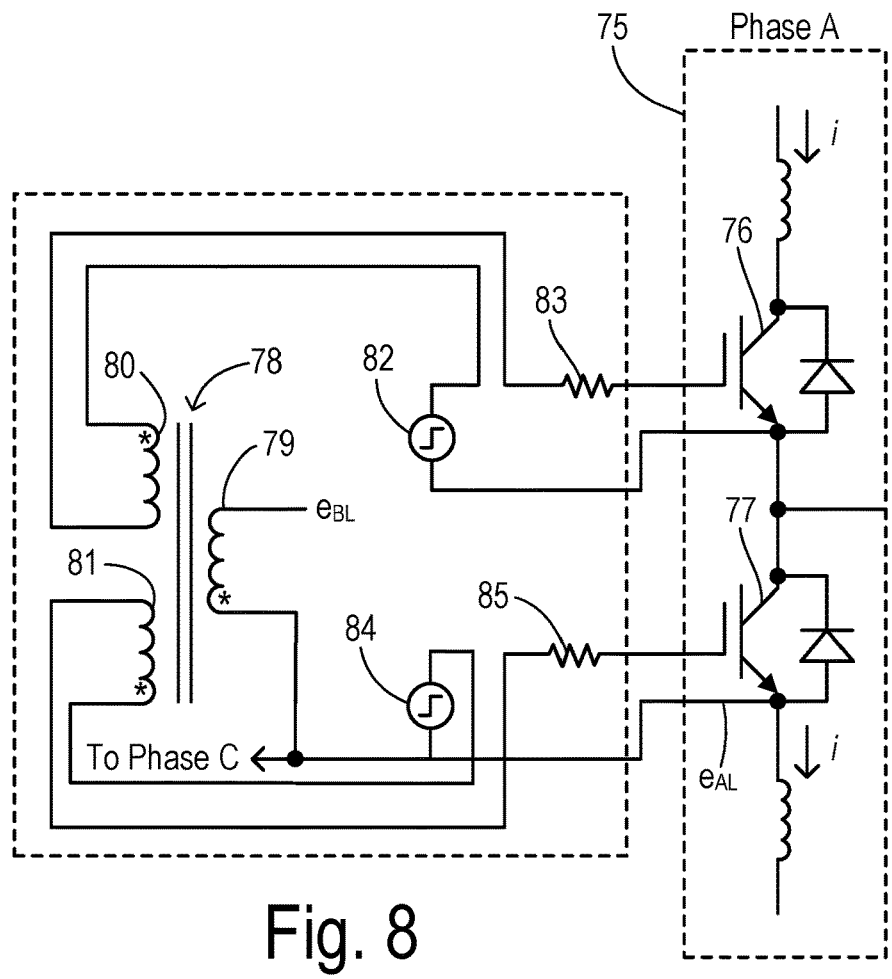
FIG. 8 is a schematic, block diagram showing another embodiment of a phase leg with gate drivers interconnected with a transformer providing a controlled enhancement of a common source inductance for the upper and lower switching devices, wherein Kelvin collector terminals are not required.

Some power modules might not have Kelvin-collector terminals (i.e., only Kelvin-emitters are available along with the usual gate, collector, and emitter terminals). In that case, an embodiment as shown in FIG. 8 can be used which connects to primary side of each transformer exclusively between Kelvin-emitter terminals of the lower transistors in two different phases (in round robin fashion). Thus, a power module 75 has an upper transistor 76 and a lower transistor 77. A transformer 78 has a primary winding 79 connected between Kelvin-emitter $e_{AL}$ of Phase A and a Kelvin-emitter $e_{BL}$ of a Phase B (not shown). Primary winding 79 is separately coupled magnetically with secondary windings 80 and 81. Secondary winding 80 is connected in a gate loop for upper transistor 76 with a gate driver 82 and gate resistor 83. Secondary winding 81 is connected in a gate loop for lower transistor 77 with a gate driver 84 and gate resistor 85.

The voltage between the Kelvin-emitters $e_{AL}$ and $e_{BL}$ can be expressed by Equation (8):

$$v_{eALeBL} = L_{AL} \cdot \frac{di_A}{dt} - L_{BL} \cdot \frac{di_B}{dt}. \tag{8}$$

Assuming the switching devices in different phases (e.g., Phase A and Phase B) do not switch simultaneously gives rise to the following equations during Phase A switching transient:

$$\frac{di_B}{dt} = 0. \tag{9}$$

The voltage created by the desired common source inductance $L_{CS}$ can be then calculated in Equation (10) for Phase A. This voltage can then be created by a transformer with turns ratio of $L_{A2}:L_{CS}$.

$$L_{CS} \cdot \frac{di_A}{dt} = \frac{L_{CS}}{L_{AL}} \cdot v_{eALeBL} \tag{10}$$

However, such an embodiment introduces interference between power modules in different phases. For example, when the switching devices in Phase A are in steady state (on or off) while devices in Phase B are switching (i.e., the Phase B gate signals are toggling), the transformer sensing the di/dt in Phase B also adds an undesired voltage to the gates of the switching devices in Phase A. In a first case, for example, when an AL transistor is in an ON state and BL is in a turn-on transient, the gate voltage of AL is further increased beyond the nominal ON voltage of 15V, which adds more stress on a gate oxide of AL and may reduce the device reliability/lifetime. In a second case, when AL is in an ON state and BL is in a turn-off transient, the gate voltage of AL is reduced which results in excessive conduction loss. In a third case, when AL is in an OFF state and BL is in a turn-on transient, the gate voltage of AL is increased. If the AL gate voltage exceeds the turn-on threshold voltage, then AL can be falsely turned-on and cause shoot-though and even failure. In a fourth case, when AL is in an OFF state and BL is in a turn-off transient, the gate voltage of AL is reduced. This case is generally not a problem unless the negative gate voltage limit is reached.

Figure 9:
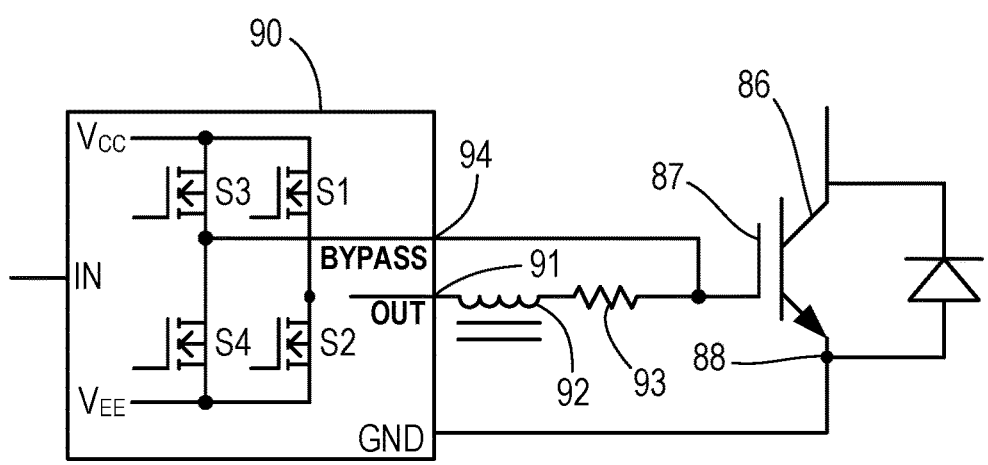
FIG. 9 is a schematic diagram showing a preferred gate driver circuit with active gate clamping for use with the embodiment of FIG. 8.
Figure 10:
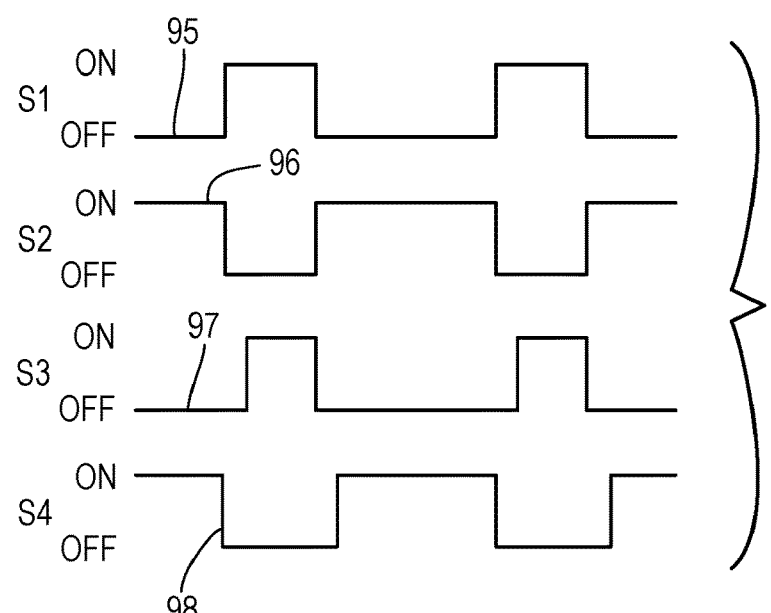
FIG. 10 is a waveform diagram showing switching command signals for the transistors of the gate driver circuit of FIG. 9.

To avoid the interference between different phases, gate drive circuits with active gate clamping capability may be used as shown in FIG. 9, wherein the driver can bypass the inductive coupling when a gate drive signal $V_{GE}$ enters a steady state. In particular, a transistor 86 has a gate terminal 87 and a Kelvin-emitter terminal 88 connected to a gate driver 90. A gate control signal (e.g., PWM signal) is input to driver 90 and controls a switch matrix with transistors S1, S2, S3, and S4 in a bridge configuration between turn-on voltage $V_{CC}$ and turn-off voltage $V_{EE}$. A driver output 91 for transitioning the output between ON and OFF states is coupled to gate terminal 87 via transformer secondary winding 92 and a gate resistor 93. The primary winding of the transformer is not shown in the figure. A bypass output 94 is connected directly to gate terminal 87 for controlling a steady state output. FIG. 10 shows a control signal timing diagram for switching signals 95-98 applied to the gates of transistors S1, S2, S3, and S4, respectively. Initially, phase leg transistor 86 is OFF with both gate driver outputs 91 and 94 tied to turn-off voltage $V_{EE}$ since transistors S2 and S4 are ON and transistors S1 and S3 are OFF. To turn on transistor 86, there are transitions in switching signals 95, 96, and 98 so that driver output 91 is tied to turn-on voltage $V_{CC}$ and the transformer circuits influence the voltage at gate terminal 87. There is a delay in the transition of switching signal 97 so that driver output 94 is floating since both transistors S3 and S4 are OFF. The delay is sufficient for the state transition of phase leg transistor 86 to complete. After the delay, switching signal S3 turns on in order to clamp gate 87 to turn-on voltage $V_{CC}$. The turn off sequence is similar, with the delay being applied to switching signal S4 which clamps gate 87 to turn-off voltage $V_{EE}$.

What is claimed is:

1. An inverter comprising;
   first and second phase legs each having respective upper and lower transistors with respective gate loops between respective gate and Kelvin-emitter terminals;
   a plurality of drivers providing respective drive signals to respective gate loops, including a first gate loop of a first one of the transistors in the first phase leg;
   a first transformer having a secondary winding in series with the first gate loop in the first phase leg and a primary winding connected to carry current between a Kelvin-emitter of the first transistor in the first phase leg and a Kelvin-emitter of a second transistor in the second phase leg.

2. The inverter of claim 1 wherein the first and second transistors are the lower transistors of the phase legs.

3. The inverter of claim 2 wherein the upper transistor of the first phase leg lacks a Kelvin-collector terminal, wherein the transformer has upper and lower secondary windings, wherein the upper secondary winding is connected in a gate loop of the upper transistor of the first phase leg, and wherein the primary winding is separately coupled to each of the upper and lower secondary windings.

4. The inverter of claim 3 wherein the primary winding and each secondary winding provide an enhanced common source inductance $L_{CS}$ and have a turns ratio corresponding to $L_{CS}:L_{AL}$, where $L_{AL}$ is a stray inductance at the first transistor.

5. The inverter of claim 4 wherein the drivers provide active clamping of the gate terminals when a respective transistor is being turned off by its respective gate signal.

6. A power converter comprising:
   a DC link with positive and negative buses configured to receive a DC supply voltage;
   first, second, and third phase legs in a bridge configuration coupled between the positive and negative buses, each phase leg having series-connected upper and lower transistors with an intermediate junction providing a phase leg output, wherein each transistor has a respective gate loop between respective gate and Kelvin-emitter terminals;
   first, second, and third upper and lower gate drive circuits for each respective phase leg supplying gate drive signals to the respective gate loops of the upper and lower transistors; and
   first, second, and third transformers wherein:
      the first transformer has a secondary winding in the gate loop of the lower transistor in the first phase leg and a primary winding connecting a Kelvin-emitter terminal of the lower transistor of the first phase leg to the Kelvin-emitter terminal of the lower transistor in the second phase leg to carry current between the Kelvin-emitter terminal of the lower transistor of the first phase leg to the Kelvin-emitter terminal of the lower transistor in the second phase leg;
      the second transformer has a secondary winding in the gate loop of the lower transistor in the second phase leg and a primary winding connecting a Kelvin-emitter terminal of the lower transistor of the second phase leg to the Kelvin-emitter terminal of the lower transistor in the third phase leg to carry current between Kelvin-emitter terminal of the lower transistor of the second phase leg to the Kelvin-emitter terminal of the lower transistor in the third phase leg; and
      the third transformer has a secondary winding in the gate loop of the lower transistor in the third phase leg and a primary winding connecting a Kelvin-emitter terminal of the lower transistor of the third phase leg to the Kelvin-emitter terminal of the lower transistor in the first phase leg to carry current between Kelvin-emitter terminal of the lower transistor of the third phase leg to the Kelvin-emitter terminal of the lower transistor in the first phase leg.

7. The power converter of claim 6 wherein the upper transistors of the phase legs each includes a respective Kelvin-collector terminal, wherein each transformer has respective upper and lower secondary windings and respective upper and lower primary windings, wherein:
   the upper secondary winding of the first transformer is connected in the gate loop of the upper transistor of the first phase leg, and wherein the upper primary winding of the first transformer connects the Kelvin-collector terminal of the upper transistor of the first phase leg to the Kelvin-collector terminal of the upper transistor of the second phase leg;
   the upper secondary winding of the second transformer is connected in the gate loop of the upper transistor of the second phase leg, and wherein the upper primary winding of the second transformer connects the Kelvin-collector terminal of the upper transistor of the second phase leg to the Kelvin-collector terminal of the upper transistor of the third phase leg; and
   the upper secondary winding of the third transformer is connected in the gate loop of the upper transistor of the third phase leg, and wherein the upper primary winding of the third transformer connects the Kelvin-collector terminal of the upper transistor of the third phase leg to the Kelvin-collector terminal of the upper transistor of the first phase leg.

8. The power converter of claim 7 wherein the lower primary and secondary windings of each transformer provide an enhanced common source inductance $L_{CS}$ and have a lower turns ratio corresponding to:

$$L_{CS}:(L_{AU}L_{BL}-L_{AL}L_{BU})/L_{BU}$$

where $L_{AU}$ and $L_{BU}$ are stray inductances of the upper transistors of the phase legs coupled by a respective transformer, and $L_{BL}$ and $L_{AL}$ are stray inductances of the lower transistors of the phase legs coupled by a respective transformer.

9. The power converter of claim 7 wherein the upper primary winding and upper secondary windings of each transformer provide an enhanced common source inductance $L_{CS}$ and have a upper turns ratio corresponding to:

$$L_{CS}:(L_{AU}L_{BL}-L_{AL}L_{BU})/L_{BL}$$

where $L_{AU}$ and $L_{BU}$ are stray inductances of the upper transistors of the phase legs coupled by a respective transformer, and $L_{BL}$ and $L_{AL}$ are stray inductances of the lower transistors of the phase legs coupled by a respective transformer.

10. The power converter of claim 6 wherein the upper transistors of the phase legs each lacks a Kelvin-collector terminal, wherein each transformer has respective upper and lower secondary windings, wherein each upper secondary winding is connected in the gate loop of the upper transistor of the respective phase leg, and wherein the primary winding of each transformer is separately coupled to each of the respective upper and lower secondary windings.

11. The power converter of claim 10 wherein coupling between the primary winding and each of the secondary windings in each respective transformer provides an enhanced common source inductance $L_{CS}$ and has a turns ratio corresponding to $L_{CS}:L_{AL}$, where $L_{AL}$ is a stray inductance at each respective lower transistor.

12. The power converter of claim 11 wherein each of the gate drive circuits provides active clamping of the respective gate loops when a respective transistor is being turned off by its respective gate drive signal.

13. An inverter comprising;
first and second phase legs each having respective upper and lower transistors with respective gate loops between respective gate and Kelvin-emitter terminals;
a plurality of drivers providing respective drive signals to respective gate loops, including a first gate loop of a first one of the transistors in the first phase leg; and
a first transformer having a secondary winding in series with the first gate loop in the first phase leg and a primary winding connected to carry current between a Kelvin-emitter of the first transistor in the first phase leg and a Kelvin-emitter of a second transistor in the second phase leg;
wherein the upper transistor of the first phase leg and the upper transistor of the second phase leg each includes a Kelvin-collector terminal, wherein the secondary winding of the first transformer has upper and lower secondary windings, wherein the upper secondary winding is connected in a gate loop of the upper transistor of the first phase leg, wherein the primary winding of the first transformer has upper and lower primary windings, and wherein the upper primary winding is connected between the Kelvin-collector terminal of the upper transistor of the first phase leg and the Kelvin-collector terminal of the upper transistor of the second phase leg.

14. The inverter of claim 13 wherein the lower primary winding and lower secondary winding provide an enhanced common source inductance $L_{CS}$ and have a lower turns ratio corresponding to:

$$L_{CS}:(L_{AU}L_{BL}-L_{AL}L_{BU})/L_{BU}$$

where $L_{AU}$ is a stray inductance at the upper transistor of the first phase leg, $L_{BL}$ is a stray inductance at the second transistor, $L_{AL}$ is a stray inductance at the first transistor, and $L_{BU}$ is a stray inductance at the upper transistor of the second phase leg.

15. The inverter of claim 13 wherein the upper primary winding and upper secondary winding provide an enhanced common source inductance $L_{CS}$ and have a upper turns ratio corresponding to:

$$L_{CS}:(L_{AU}L_{BL}-L_{AL}L_{BU})/L_{BL}$$

where $L_{AU}$ is a stray inductance at the upper transistor of the first phase leg, $L_{BL}$ is a stray inductance at the second transistor, $L_{AL}$ is a stray inductance at the first transistor, and $L_{BU}$ is a stray inductance at the upper transistor of the second phase leg.

* * * * *